United States Patent [19]
Wagshul et al.

[11] Patent Number: 5,793,784
[45] Date of Patent: Aug. 11, 1998

[54] APPARATUS AND METHOD FOR SPECTRAL NARROWING OF HIGH POWER DIODE LASER ARRAYS

[75] Inventors: Mark Wagshul, Huntington, N.Y.; Eli Miron, Omer, Israel

[73] Assignees: The Research Foundation of State University of New York, Albany, N.Y.; The Trustees of Princeton University, Princeton, N.J.

[21] Appl. No.: 814,096

[22] Filed: Mar. 10, 1997

[51] Int. Cl.$^6$ ..................................................... H01S 3/10
[52] U.S. Cl. .............................. 372/32; 372/99; 372/101; 372/106
[58] Field of Search ........................ 372/32, 29, 99, 372/101, 106, 92, 18, 108

[56] References Cited

U.S. PATENT DOCUMENTS

| | | | |
|---|---|---|---|
| 5,386,426 | 1/1995 | Stephens | 372/20 |
| 5,555,253 | 9/1996 | Dixon | 372/32 |
| 5,706,301 | 1/1998 | Lagerström | 372/32 |

OTHER PUBLICATIONS

Stephens, et al., "Diode–Pumped Upconversion Laser with 100–mW Output Power," *Optics Letters*, vol. 18, No. 1, pp. 34–36, (Jan. 1993).

Primary Examiner—James W. Davie
Attorney, Agent, or Firm—Hoffmann & Baron, LLP

[57] ABSTRACT

An apparatus for spectral narrowing of high power diode laser arrays includes a high power diode laser array configured for production of an output light beam, a collimator configured for collimation of the output light beam, and a half-wave plate and polarizing beamsplitter positioned to receive the output light beam and to separate it into a feedback beam and a usable beam. The apparatus further includes an interference filter positioned to receive the feedback beam and form it into a filtered feedback beam. The filter has a narrow passband about a desired wavelength. The apparatus still further includes a cat's eye reflector to receive the feedback beam, direct it through the interference filter, and couple the filtered feedback beam into the diode laser array. A method for spectral narrowing of high-power diode laser arrays includes the steps of collimating the light output from the high power diode laser array; passing it through a beamsplitter to obtain feedback and usable beams; passing the feedback beam through an interference filter to form a filtered feedback beam; and coupling the filtered feedback beam back into the diode laser array.

13 Claims, 8 Drawing Sheets

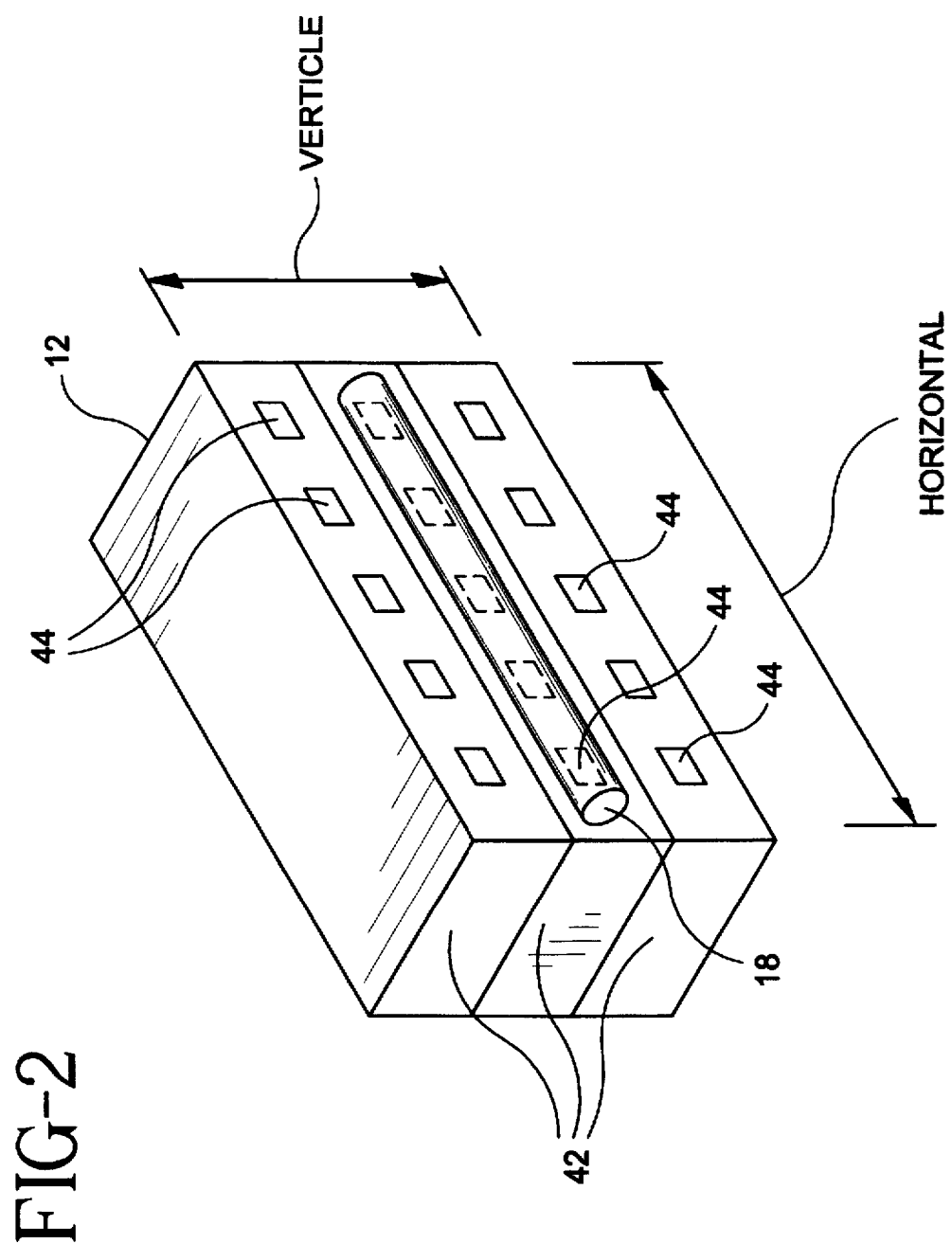

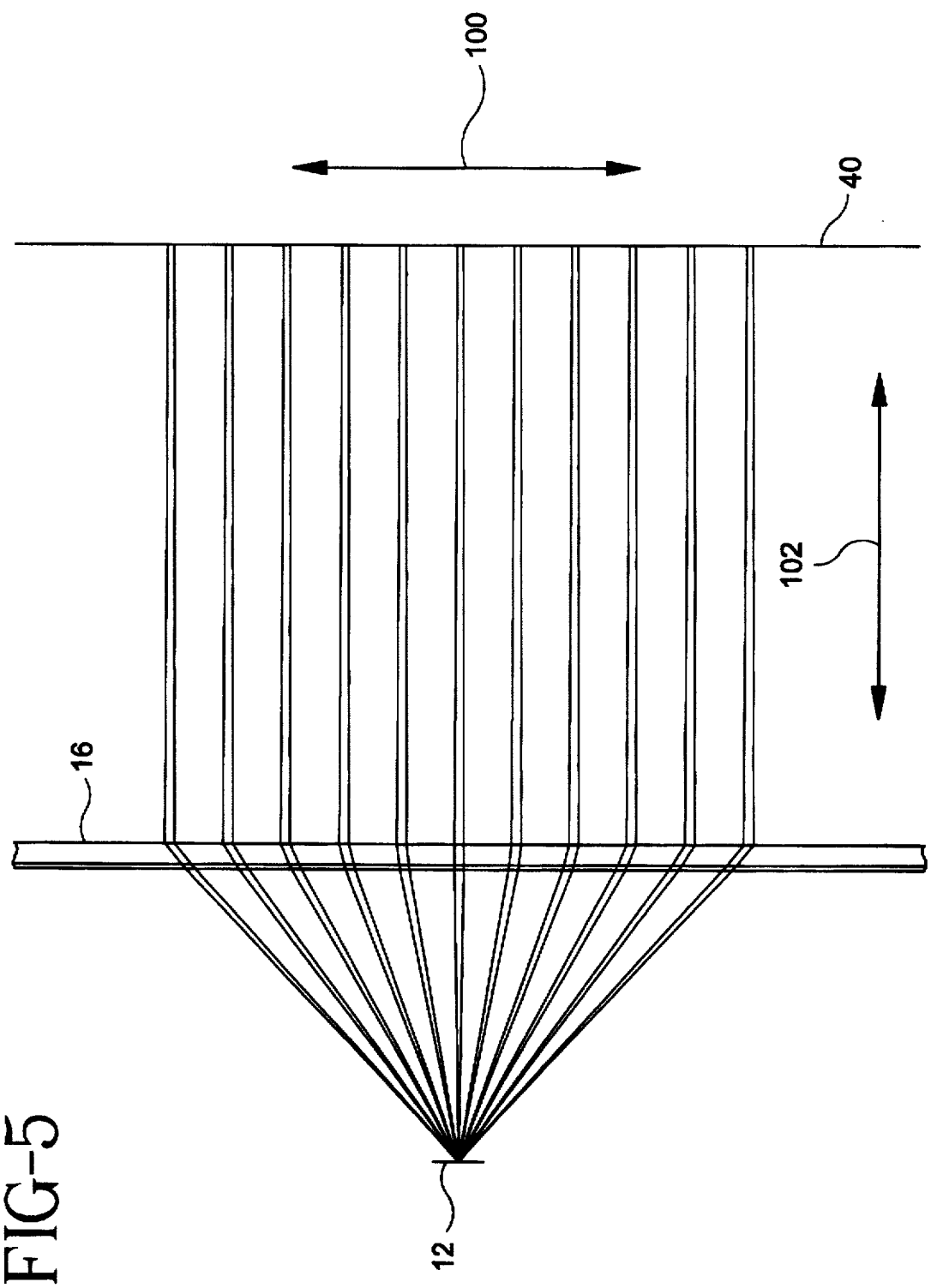

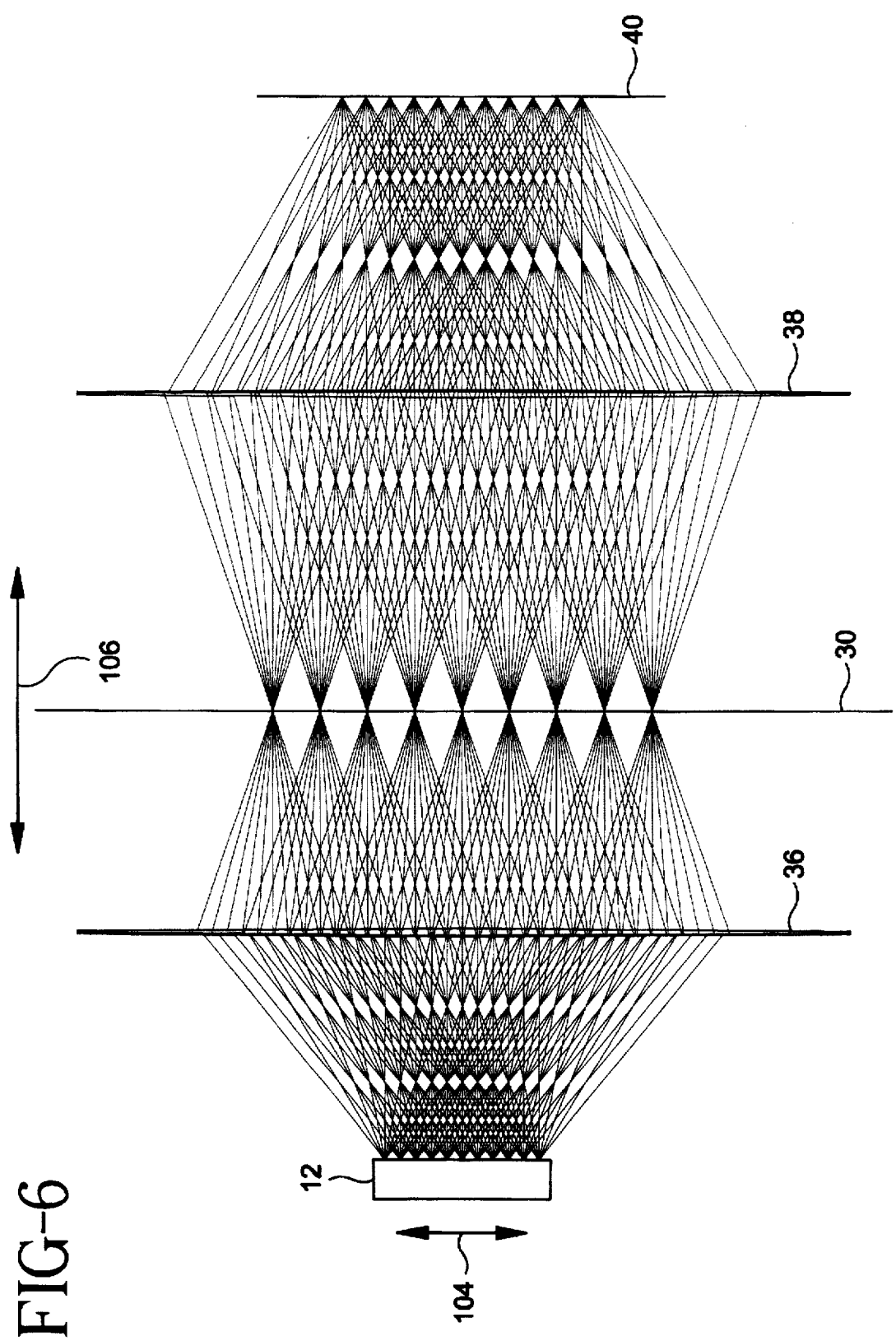

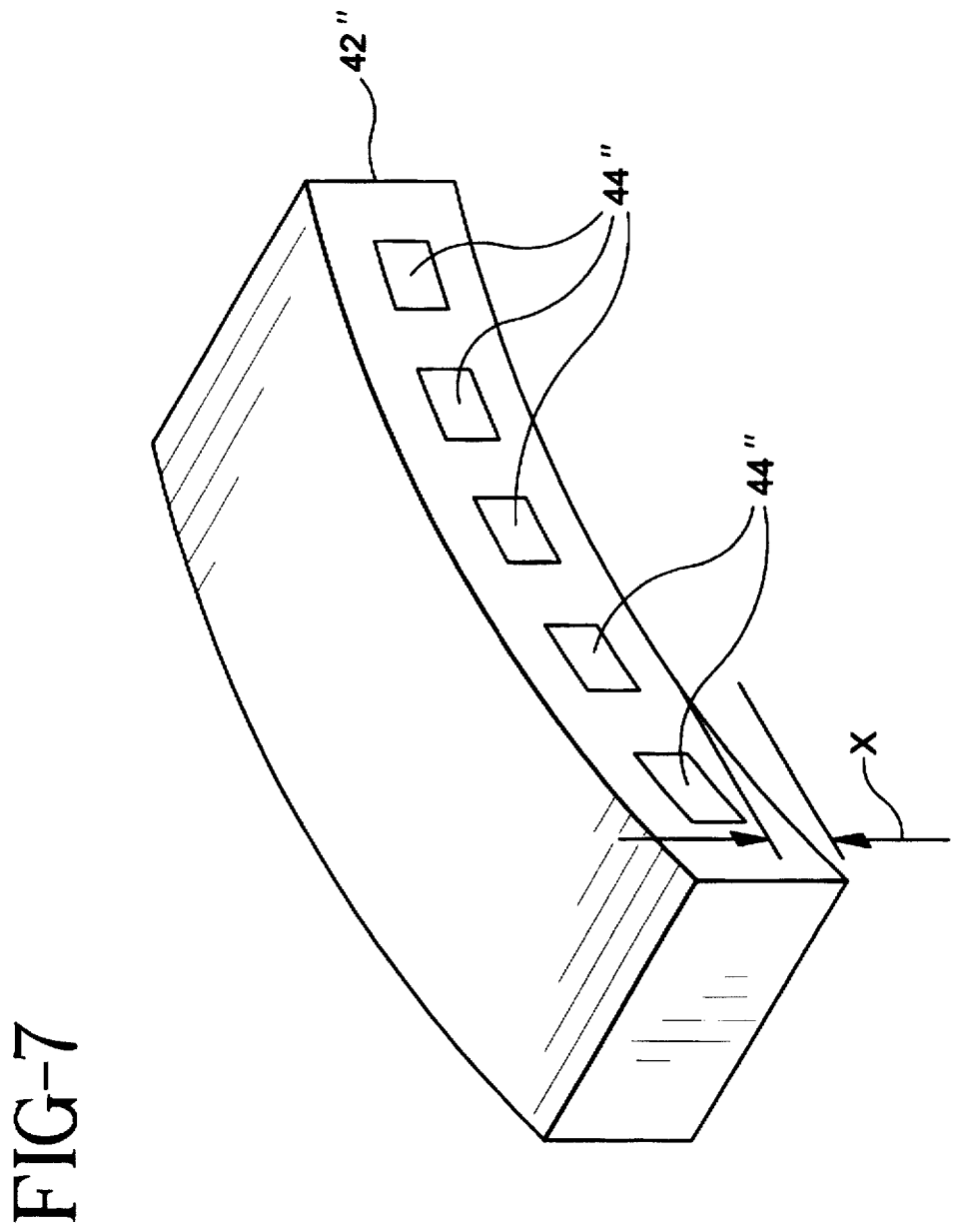

APPARATUS AND METHOD FOR SPECTRAL NARROWING OF HIGH POWER DIODE LASER ARRAYS

STATEMENT OF GOVERNMENT RIGHTS

This invention was made with Government support under contract PHY-9520895 awarded by the National Science Foundation. The Government has certain rights in the invention.

BACKGROUND OF THE INVENTION

1. Field of the Invention

The present invention relates generally to laser technology, and more particularly relates to an apparatus and method for spectral narrowing of light output from a high power diode laser array.

2. Description of the Prior Art

Numerous applications currently utilize high power laser technology and would benefit greatly from inexpensive sources of narrow-band laser radiation. A few examples of such applications are optical pumping of alkali vapors for noble gas imaging, laser remote sensing and pumping of solid state lasers. The prior art includes the solid state laser, typically pumped with a large-frame ion laser. While such prior art systems can achieve relatively high power, they are quite expensive (and hence use of multiple systems is impractical), they have very low electrical-to-optical efficiency, and they usually require laser expertise to maintain and operate. An ion-pumped Titanium:Sapphire laser system might cost $100,000–$150,000, consume 2–3 kW of power and only supply up to 4–5 W of output power.

Within the last few years, very high power lasers have been realized through semiconductor technology. Diode laser units (typically configured as an array of multiple laser elements, or a "diode laser array" (DLA)) with output powers in excess of 100 W are now commercially available. The advantages of these devices include high electrical-to-optical efficiency, ease of use and low cost (100 W units are currently available for about $10,000–$20,000). High power diode laser arrays have already gained widespread use in the field of solid state laser pumping and are quickly replacing large-frame ion laser systems. However, for many applications, diode laser arrays have an important drawback: the spectral bandwidth of the laser light is very broad (2–3 nm, compared to less than 0.1 nm for ion or solid state laser systems) and is often many times the width of the atomic absorption line which is being excited. This large width is due to two factors: first, the natural linewidth of the multimode individual elements is typically 1–1.5 nm, and second, temperature variations and materials processing limitations tend to further broaden the overall array bandwidth to 2–3 nm (minimum width). As an example, optical pumping of atomic vapors (which is used for production of laser-polarized noble gases) ideally requires a laser source with a 0.1–0.3 nm width. While use of high power diode laser arrays would be inexpensive, they thus far have proven to be very inefficient. Even with the best optical pumping schemes, only 20–30% of the laser light is used. Thus, there is great need for an efficient, low cost and high power diode laser system which can begin to approach the linewidth specifications more typical of solid state laser systems.

One possible approach to overcoming these problems, in a low-power application, is set forth by Stephens and McFarlane. R. R. Stephens & R. A. McFarlane, "Diode-Pumped Upconversion Laser With 100-mW Output Power," 18 *Optics Letters* 34–36 (Jan. 1, 1993). Using a small (only 4 element) diode laser array, Stephens and McFarlane pass a portion of the output light into a feedback arrangement consisting of a collimating lens, half-wave plate, laser-polarizing beamsplitter, a pair of cylindrical singlet lenses, and diffraction grating. Substantial narrowing of the output bandwidth results (from 1.6 nm down to 0.1 nm). However, diffraction gratings, while inexpensive and wavelength-tuneable, are very sensitive to divergence, and thus are effective only with point sources or very small arrays which can be well collimated. This effectively makes the apparatus of Stephens and McFarlane unusable in high power applications. Further details are provided in U.S. Pat. No. 5,386,426 to Stephens.

In view of the high cost and size, and relatively low efficiency, of large frame ion lasers, as well as the limited power capability of the narrow spectral linewidth diode laser array disclosed by Stephens and McFarlane, there is a need for a technique for spectral narrowing of high power diode laser arrays.

OBJECTS AND SUMMARY OF THE INVENTION

It is an object of the present invention to provide a method for spectral narrowing of light output from a high power diode laser array.

It is another object of the present invention to provide such a method which is efficient and inexpensive.

It is a further object of the present invention to provide an apparatus for spectral narrowing of light output from a high power diode laser array.

It is still a further object of the present invention to provide such an apparatus which can be effectively employed with large high power diode laser arrays having many individual laser elements.

In accordance with one form of the present invention, an apparatus for spectral narrowing of light output from a high power diode laser array includes a high power diode laser array configured for production of an output light beam, a collimator operatively associated with the diode laser array for collimation of the light output beam in the direction perpendicular to the laser array (hereinafter referred to as the vertical direction), and beamsplitter means positioned to receive the output light beam and separate it into a feedback beam and a usable beam. The apparatus further includes an interference filter positioned to receive the feedback beam. The interference filter has a narrow passband about a desired wavelength, and forms a spectrally filtered feedback beam. Finally, the apparatus includes a lens and mirror assembly (cat's eye reflector) positioned to receive the feedback beam, direct it through the interference filter, and then to couple the filtered feedback beam into the diode laser array. The interference filter may be positioned, for example, between first and second lenses of the cat's eye reflector, or just in front of the (feedback) mirror portion of the cat's eye reflector.

The collimator can include a cylindrical fiber type collimating microlens located intermediate the diode laser array and the polarizing beamsplitter assembly. The collimator can further include a vertical collimation lens positioned intermediate the half-wave plate and polarizing beamsplitter assembly and the cat's eye reflector. The cat's eye reflector can include first and second cylindrical lens elements positioned past the beamsplitter means, and a mirror positioned to receive the feedback beam and direct it back into the diode laser array. The beamsplitter means can include a half-wave plate and a polarizing beamsplitter.

In a method for spectral narrowing of light output from a high power diode laser array, in accordance with the present invention, the light output from the high power diode laser array is vertically collimated. The light output is passed through beamsplitter means to separate the light output into a feedback beam and a usable beam. The feedback beam is passed through an interference filter having a narrow passband about a desired wavelength to form a filtered feedback beam. The filtered feedback beam is then coupled back into the diode laser array.

The step of coupling the filtered feedback beam back into the diode laser array may include passing the feedback beam through a cat's eye reflector. The coupling step may include the sub-steps of passing the feedback beam through a first lens element of a lens portion of the cat's eye reflector, prior to passing the feedback beam through the interference filter; then passing the filtered feedback beam through a second lens element of the lens portion of the cat's eye reflector; then reflecting the filtered feedback beam off a mirror portion of the cat's eye reflector; and finally passing the reflected feedback beam back through the lens portion of the cat's eye reflector.

The collimating step may include passing the light output through a cylindrical fiber type collimating lens prior to passing the light output through the beamsplitter means. The collimating step can also include passing the feedback beam through a vertical collimation lens subsequent to passing the light output through the beamsplitter means. The step of passing the light output through the beamsplitter means can include passing the light output through a half-wave plate and polarizing beamsplitter.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 is an enlarged perspective view of a high power diode laser array which may be employed in the apparatus of FIG. 1, showing a cylindrical fiber type collimating lens;

FIG. 5 is a ray-tracing diagram which illustrates operation of a vertical collimation lens employed with the invention;

FIG. 6 is a ray-tracing diagram which illustrates operation of a cat's eye reflector employed with the invention; and FIG. 7 is an enlarged perspective view of a laser array deformity known as "smile."

DETAILED DESCRIPTION OF THE PREFERRED EMBODIMENTS

Figure 1A:
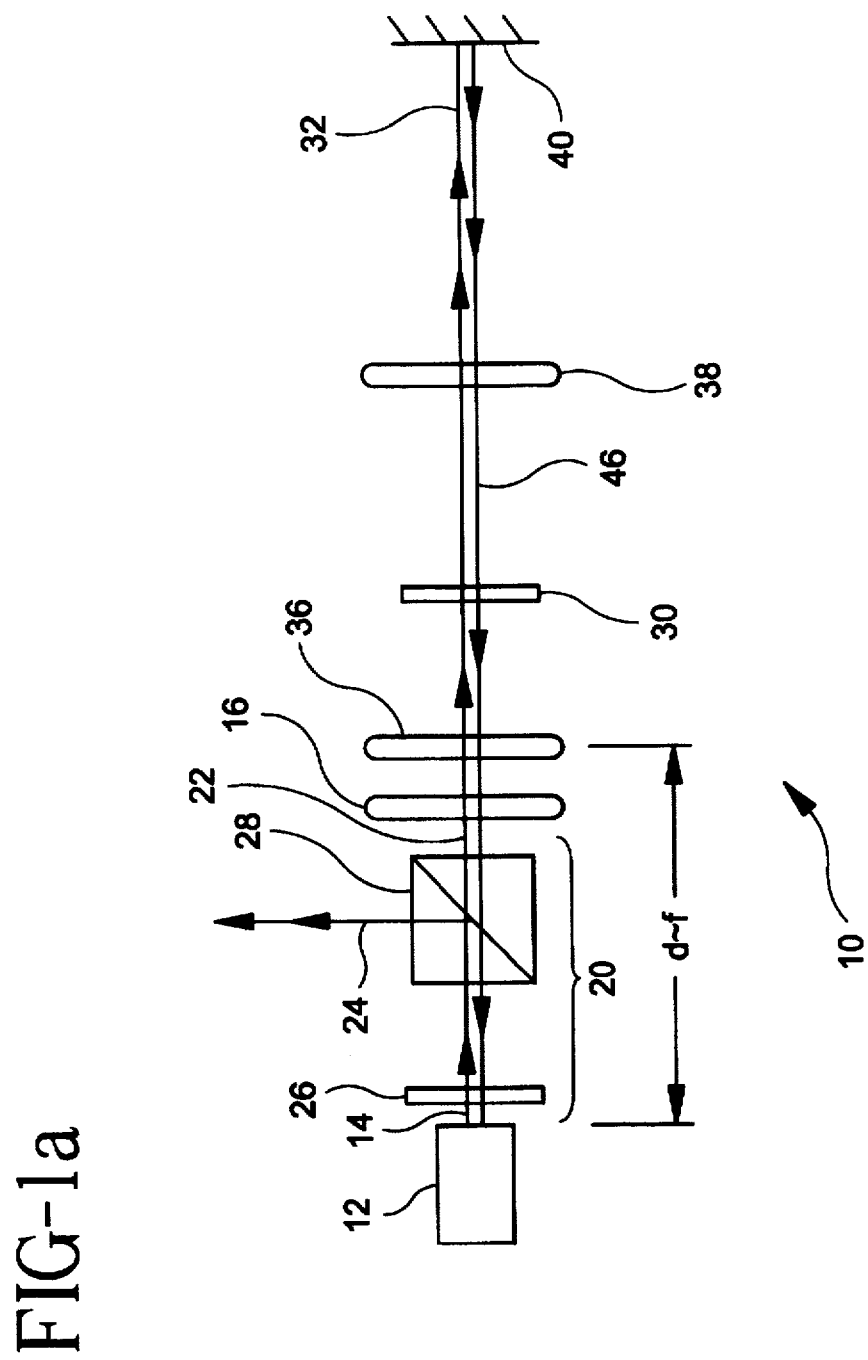
FIG. 1(a) is a schematic view of an apparatus for spectral narrowing of high power diode laser arrays in accordance with the present invention.

Referring to FIG. 1(a), an apparatus for spectral narrowing of high power diode laser arrays, designated generally as 10, includes a high power diode laser array 12 configured for production of an output light beam 14. Suitable arrays are available from OptoPower Corp. of Tucson, Ariz. The apparatus further includes a collimator, which may include vertical collimation lens 16 and cylindrical fiber type collimating lens 18 (as shown in FIG. 2 and discussed fully below). Beamsplitter means 20 are positioned to receive the output light beam 14 and separate it into a feedback beam 22 and a usable beam 24. Where vertical collimation lens 16 is employed, the beamsplitter means 20 is preferably positioned intermediate laser array 12 and vertical collimation lens 16. The beamsplitter means 20 preferably includes half-wave plate 26 and polarizing beamsplitter 28. Note that output of the diode laser array 10 is typically highly polarized. For output which is not highly polarized, alternative beamsplitter means can be employed.

Figure 1B:
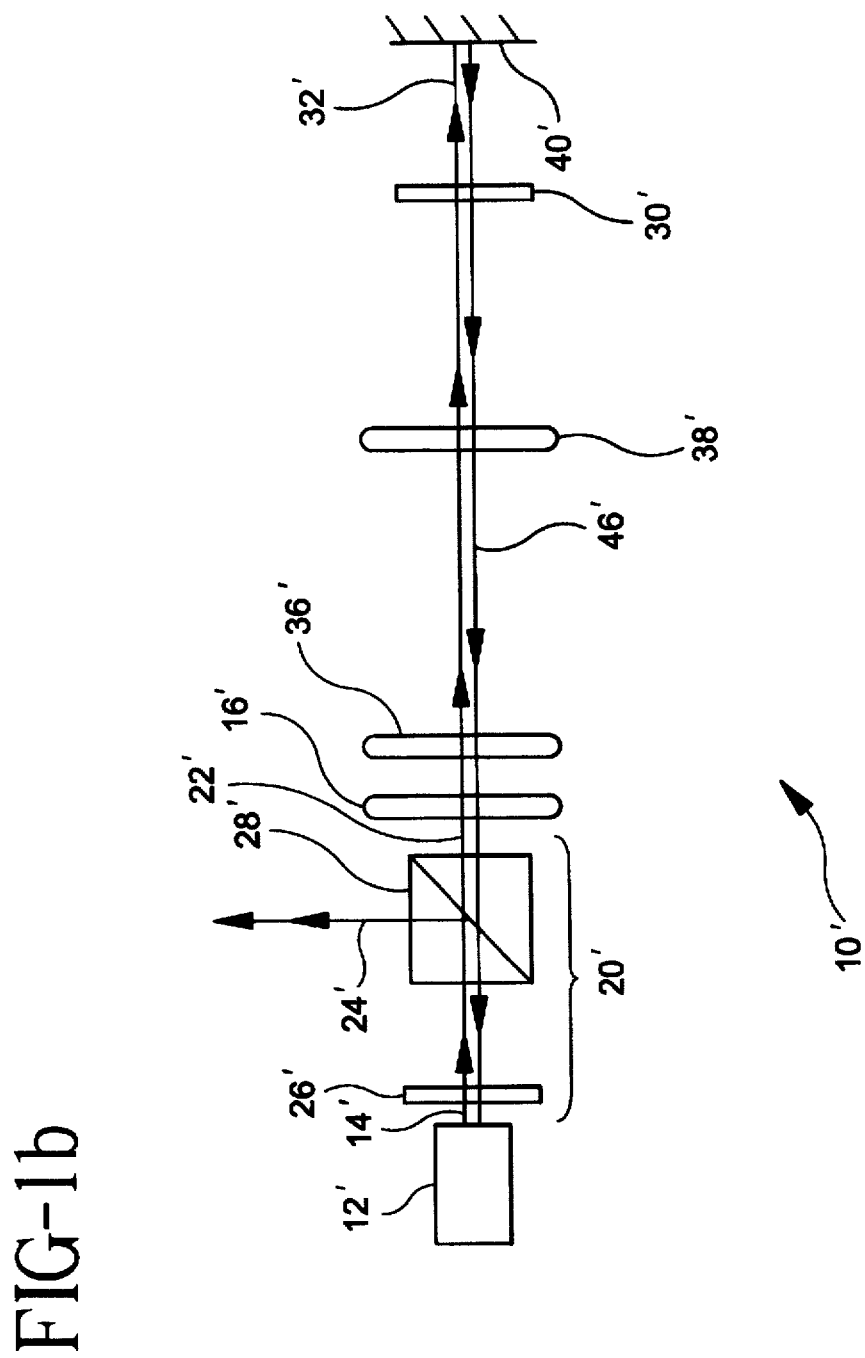
FIG. 1(b) is an alternative embodiment of apparatus in accordance with the present invention.

Apparatus 10 further includes an interference filter 30 which is positioned to receive feedback beam 22 and form a filtered feedback beam 32. Suitable filters are available from Omega Optical of Brattleboro, Vt. Filter 30 should have a bandwidth close to the desired laser linewidth (typically 0.2 to 0.5 nm). Finally, apparatus 10 includes a cat's eye reflector, such as that formed by first and second cylindrical lens elements 36 and 38 and feedback mirror 40, which is positioned to receive the feedback beam 22, direct it through the interference filter 30, and then to couple the filtered feedback beam back into the diode laser array 12. Where vertical collimation lens 16 is employed, elements 36 and 38 are preferably positioned past the vertical collimation lens 16. Interference filter 30 is preferably positioned between lens elements 36 and 38, since divergence angles are relatively small in that region, resulting in a smaller narrowing limit for the apparatus 10. An alternative embodiment is shown in FIG. 1(b), wherein like elements have received the same reference numerals with a "prime." As shown in FIG. 1(b), filter 30' can be located past elements 36', 38' adjacent mirror 40'.

Referring now to FIG. 2, further details of high power diode laser array 12 and cylindrical fiber type collimating lens 18 are shown. FIG. 2 defines horizontal and vertical directions as used throughout this application. Array 12 preferably includes a number of laser sub-arrays 42 (typically referred to as so-called "laser bars" by laser manufacturers), each of which in turn includes a number of individual output facets 44. FIG. 2 depicts, for illustrative purposes, an array 12 with three sub-arrays 42. The sub-arrays are illustrated as having five output facets 44 each. It is to be understood that any convenient number of sub-arrays 42 and output facets 44 may be employed. In a typical 100 W array, ten 10 W sub-arrays, each having from 10–30 output facets, might be employed. A typical output facet can have dimensions on the order of 1×200 microns. Lens 18 can be an ordinary single-mode optical fiber (core only, no cladding). However, in this application it operates as an f=1 cylindrical collimating lens (transmitting light perpendicular to the fiber axis), not as an optical waveguide which transmits light along its axis by total internal reflection. Lens 18 can be fastened in place over a row of output facets 44 by any convenient means, including bonding with epoxy. Although FIG. 2 shows a lens 18 associated with only the row of output facets 44 of the middle laser sub-array 42, it is to be understood that normally each row of facets 44 will be provided with a lens 18.

The collimator is operatively associated with diode laser array 12 for collimation of output light beam 14. As noted, the collimator may include vertical collimation lens 16 (for example, an 80 mm vertical collimation lens) and cylindrical fiber type collimating lens 18 which is located intermediate diode laser array 12 and beamsplitter means 20. Lenses 16 and 18 combine to provide essentially perfect collimation of the vertical axis. (Note that lens element 36 will provide some partial collimating effect of the horizontal axis; however, the "collimator" discussed herein is with reference to the vertical axis).

While the individual laser elements 44 of a given sub-array 42 are depicted in FIG. 2 as being positioned on the same vertical level, there is normally a small curvature due to buckling of the array during the mounting procedure. This effect is experienced by all current diode laser array manufacturers, and is referred to as "smile." FIG. 7 shows a single sub-array 42" with the buckling characteristic of "smile." Dimension X represents the maximum displacement of the buckled sub-array, and may typically be on the order of 10 µm. The laser output facets in FIG. 7 are designated as 44".

When coupled with the cylindrical fiber type lens 18, the smile is highly magnified and produces a divergent beam in which each individual element 44 is propagating at a slightly different angle. If left uncorrected, this divergence would destroy the feedback coupling efficiency for the entire array since each element would require a slightly different optimum tilt angle for mirror 40 in order to couple the feedback beam back into that element. Vertical collimation lens 16 is accordingly provided, and serves two purposes: it corrects any error in the positioning of lens 18, thereby collimating the individual laser elements, and it also collimates the beam as a whole (e.g., a magnified smile of 3 mm at lens 18 would produce a 3 mm smile at mirror 40 as well). With this configuration, all of the beams are traveling parallel to one another and can be coupled back with feedback mirror 40 aligned at the same optimum tilt angle. FIG. 5 is a ray-tracing diagram which illustrates this effect for a 240 µm diameter microlens 18. In FIG. 5, the vertical direction 100 is expanded by a factor of 25 with respect to the beam propagation direction 102, for clarity.

Referring back to FIGS. 1(a) and 2, it can be seen that, in operation, light emitted from each laser output facet 44 (together forming output light beam 14) passes through lens(es) 18 and then through half-wave plate 26. Half-wave plate 26 rotates the polarization of output beam 14 in order to control the percentage of light which is passed through the polarizing beamsplitter 28 to constitute the feedback beam 22 and the percentage which is passed out of the beamsplitter 28 to constitute the usable beam 24. As discussed below, typically 20% of the output beam 14 is passed through to constitute the feedback beam 22 while the remaining 80% is passed out to form the usable beam 24. Feedback beam 22 is further collimated by vertical collimation lens 16 (as discussed above) and then passes through first and second cylindrical lens elements 36, 38 of the cat's eye reflector. Vertical collimation lens 16 reduces vertical spreading down to about 0.1 degree.

Lens elements 36, 38 are spaced apart by a distance equal to the sum of their focal lengths. These might be, for example, 100 mm for lens 36 and 200 mm for lens 38. Lens element 36 is preferably placed at a position which minimizes beam divergence, selected by locating lens element 36 a distance d from diode laser array 12 which is approximately equal to focal length f of lens element 36. Mirror 40 is preferably positioned near the focal plane of lens element 38. Lens elements 36, 38 preferably form a magnified image of the laser array 12 in the plane of mirror 40. Typically, the magnification might be 1–3 times. The enlarged image of the laser array 12 which is reflected from the mirror 40 is then reduced in size as it reflects back through lens elements 36 and 38 and is of original size when it impinges back on laser array 12. It is to be understood that the light from each laser output facet 44 is preferably imaged back onto itself. In FIGS. 1(a) and 1(b), reflected feedback beam 46 has been shown coupling back into laser array 12 slightly displaced from output beam 14 for purposes of illustrative convenience only. Further, it should be noted that beams 14, 22, 24, 32 and 46 are shown in FIGS. 1(a) and 1(b) as traveling simple straight paths; for illustrative convenience their actual paths through the various lenses have not been shown. FIG. 6 is a ray-tracing diagram showing the relationship between diode laser array 12, lens elements 36 and 38, interference filter 30 and mirror 40. In FIG. 6, the vertical direction 104 is expanded by a factor of 100 with respect to the beam propagation direction 106, for clarity.

Interference filter 30 is employed to narrow the bandwidth of the feedback beam 22. As explained below, by narrowing the bandwidth of the feedback beam 22, the gain produced by the laser array 12 can be concentrated in a narrow spectral region. The filter 30 may typically have a transmission of between 35% (for a 0.15 nm filter) to 60% (for a 0.6 nm filter). It is to be understood that, since feedback beam 22 passes through filter 30, forming filtered feedback beam 32, which is then reflected by mirror 40 to form reflected feedback beam 46 which again passes through filter 30, the filter attenuation losses encountered in the embodiment shown in FIG. 1 (a) (and in FIG. 1(b)) are twice what they would be for a single pass through the filter. All the light in reflected feedback beam 46 passes through beamsplitter 28 and is directed back to laser array 12, since the light in feedback beam 46 has previously been polarized so as to pass through beamsplitter 28.

It is to be understood that beamsplitter means 20 is not limited to the combination of half-wave plate 26 and polarizing beamsplitter 28. It would be possible to employ a standard beamsplitter which passed through and passed out the appropriate percentages of light (say 30% passed through and 70% passed out). However, in this case, the light in reflected feedback beam 46 would not all pass through the standard beamsplitter and back into the laser array 12; rather, it would again be split resulting in two usable beams and a reduced amount of light coupled back into laser array 12. Thus, use of half-wave plate 26 and polarizing beamsplitter 28 is the preferred approach.

Interference filter 30 is formed with multiple layers of an optical coating (such as Magnesium Fluoride) having precisely controlled thicknesses. Reflection at the interfaces results in destructive interference at all wavelengths except the desired wavelength. Such filters are typically produced by means of sputtering a coating on glass. It should be noted that interference filters have specific power limits, and may possibly be damaged by high laser powers. The aforementioned Omega Optical typically rates filters at 5 W/cm$^2$. Using forced air cooling in the present invention, no damage has been noted in a range of 5–10 W/cm$^2$. Effective heat dissipation may be needed at higher operating powers.

Figure 3:
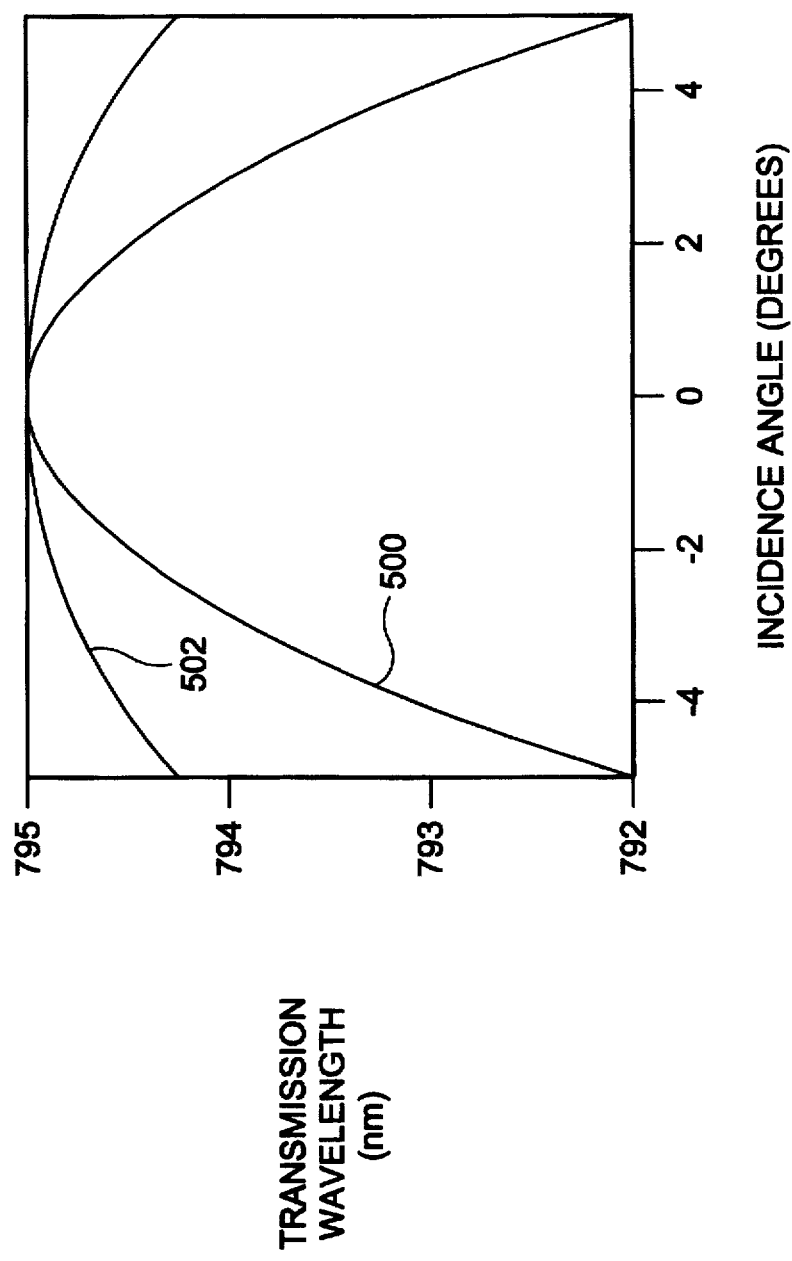
FIG. 3 is a plot of transmission wavelength versus incidence angle for both an interference filter and a diffraction grating.

As discussed above, since divergence is inherent in a macroscopic array such as laser array 12 employed in the present invention, it is important that the passband of the interference filter be relatively insensitive to divergence. FIG. 3 shows plots of transmission wavelength versus incidence angle for a diffraction grating (curve 500) and an interference filter (curve 502). Note that curve 500 is developed for incidence angle measured normal to the diffraction grating rulings. As can be seen, the transmission wavelength of the interference filter is much less sensitive to incidence angle than that of the diffraction grating. While a diffraction grating has the advantage of being tunable with angle over a wide range, such tunability is not required in application to the present invention, so that the interference filter 30, which operates at a fixed wavelength and is advantageously insensitive to divergence, may be employed. With a 4 degree divergent beam, a diffraction grating might typically yield a 2 nm bandwidth. With the present invention, improvement by a factor of 4, down to about a 0.5 nm bandwidth, is possible.

Further insight into the improvement afforded by the present invention is possible by comparing the resonance condition for a diffraction grating with that for an interference filter. For the diffraction grating:

$m\lambda = 2d \sin \theta \cos \epsilon$ where:
m=diffraction order
$\lambda$=refracted wavelength (approximately 795 nmn)
d=grating period (approximately 0.8 μm)
θ=grating operation angle (approximately 20°–30°)
ε=divergence angle (in direction perpendicular to θ) (approximately 0°–5°).

This is to be contrasted with the resonance condition for an interference filter:

$\lambda = \lambda_{max}[1-(n_0/n_c)^2 \sin^2\alpha]^{1/2}$ where:
$\lambda$=transmitted wavelength
$\lambda_{max}$=filter design wavelength
$n_0$=index of refraction of air (approximately 1)
$n_c$=effective index of refraction of filter (typically 1.5–2)
α=angle of incidence.

Accordingly, with vertical spreading reduced down to about 0.1 degree by vertical collimation lens 16 and with horizontal spreading of about 2 degrees, there is about a 0.1–0.2 nm limitation on the narrowing potential of filter 30.

It should be noted that an additional advantage of the present invention employing the interference filter also arises due to the lower sensitivity of the interference filter to changes in incidence angle in either the vertical or horizontal directions. Comparing the resonance conditions for the interference filter and the diffraction grating, it will be appreciated that the diffraction grating is more sensitive to variations in the angle θ than to variations in the angle ε, for small variations of both angles from the operating values. In the interference filter, variation is the same in the two directions. For small changes in α, λ for the interference filter will vary as $\alpha^2$; similarly, for small changes in ε, λ for the diffraction grating will vary as $\epsilon^2$. However, small changes in θ, for the diffraction grating, result in changes in λ which vary more rapidly (i.e., linearly).

Tuning of the laser wavelength is possible with the interference filter 30, by tilting the filter about the horizontal direction, thereby giving each layer of the filter a new (and larger) effective thickness (as seen by the feedback beam 22). Tilting about the vertical axis will degrade the laser linewidth due to the horizontal angular dispersion. It will be appreciated that the interference filter is initially selected to operate at normal incidence at or slightly above the nominally desired wavelength. This is because the design wavelength of the filter, $\lambda_{max}$, cannot be exceeded; tilting can only produce lower wavelengths. Thus, selecting the interference filter to operate at normal incidence slightly above the nominally desired wavelength permits tuning the wavelength down to values both below, and slightly above, the nominally desired value. Note that a diffraction grating can tune to any desired wavelength.

Figure 4:
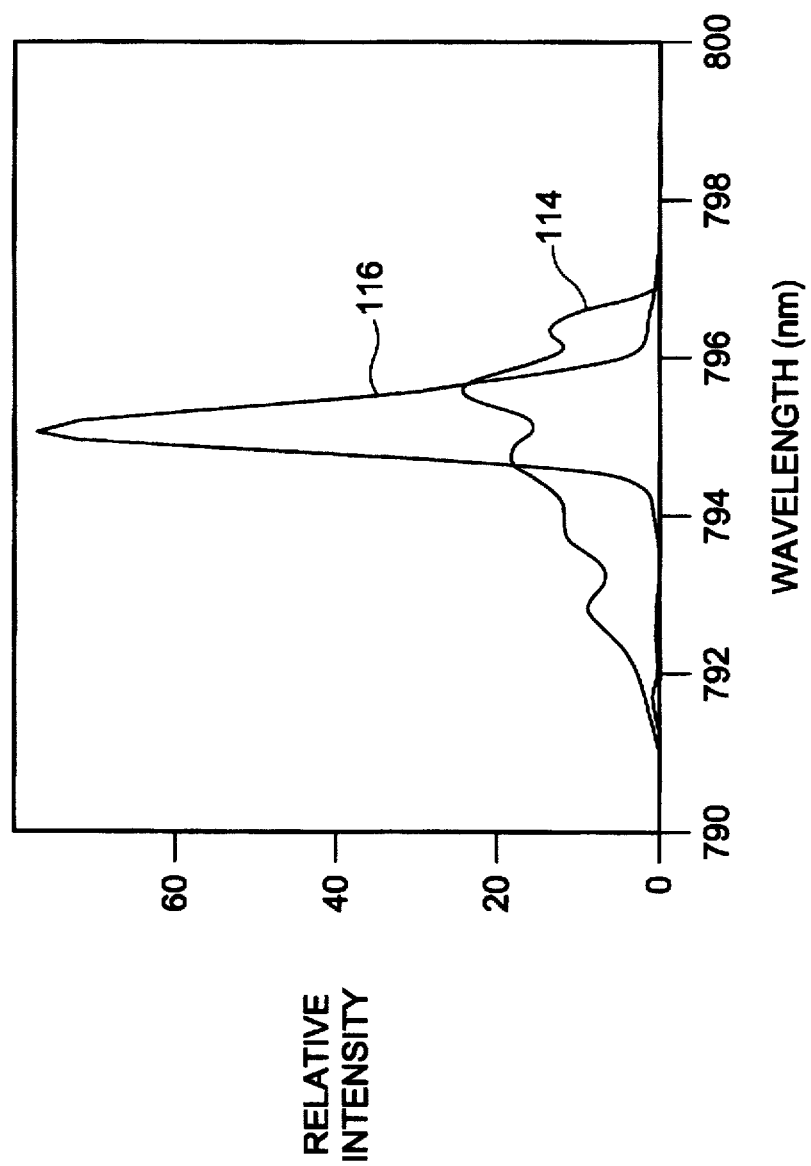
FIG. 4 is a plot of relative intensity versus wavelength showing the degree of spectral narrowing achieved with the present invention.

The manner in which filtering of the feedback beam 22 produces spectral narrowing of the output will now be discussed. Referring to FIG. 4, which is a plot of relative intensity versus wavelength for both an array without spectral narrowing (curve 114) and for an array employed with the present invention (curve 116), it can be seen that the curve for the array without spectral narrowing 114 has a number of localized peaks spread over a fairly broad bandwidth. The curve for the array without spectral narrowing 114 can be thought of as being analogous to a free oscillation wherein each individual output facet 44 laser in its own bandwidth depending on its own physical characteristics (size, semiconductor material imperfections, and the like). Since there is a limited amount of injection current, and thus a limited amount of gain, there is a limited amount of output light available. By employing the narrowed feedback beam provided by the present invention, the laser array now acts as an amplifier, that is, the narrow linewidth feedback beam draws the gain out of the undesired modes and causes the gain to be used up or saturated in the desired narrow bandwidth. This process can be thought of as being analogous to a forced oscillation. As can be seen, with the present invention 116, the intensity is concentrated in a sharp, narrow peak at a desired wavelength. Using the present invention, the spectral brightness (intensity divided by effective bandwidth) of the laser array is increased by more than 100%. The data in FIG. 4 are for a 0.6 nm interference filter, a single 20 W laser sub-array and 30% feedback. The narrowed bandwidth is 0.7 nm. Both curves have equal integrated intensity.

The success of the present invention is essentially dependent both on efficiently coupling the laser light back into all of the elements (facets 44) of the laser array 12 (using the maximum possible amount of light in the feedback beam 22), and on narrowing the linewidth of the feedback beam 22 as much as possible. It is believed that with optimized coupling optics and narrower bandwidth interference filters, enhancement of 200% or greater will be attainable.

In order to achieve the best performance, it is presently believed that 70–90% of the output light beam 14 should be passed out of the polarizing beamsplitter 28 into the usable beam 24, with 10–30% being passed through into the feedback beam 22. If there is an attempt to take more light out in the usable beam 24, all of the gain will not be used up in the center (narrow) portion of the band so that the relative intensity versus wavelength curve will have an undesirable lower peak and broader bandwidth. Further, attempting to pass more light through into the feedback beam 22 will undesirably limit the usable beam 24. Of course, it is to be understood that percentages other than 70–90% usable/ 10–30% feedback can be employed without departing from the spirit or scope of the invention.

In a method according to the present invention, light output, such as output light beam 14, from high power diode laser array 12, is collimated and is passed through beamsplitter means 20 to separate it into feedback beam 22 and usable beam 24. The feedback beam 22 is passed through interference filter 30, which has a narrow passband about a desired wavelength, in order to form filtered feedback beam 32. The filtered feedback beam 32 is then coupled back into the diode laser array 12.

Coupling of the filtered feedback beam 32 back into laser array 12 preferably includes passing the feedback beam through the cat's eye reflector. Most preferably, the coupling step includes the sub-steps of passing feedback beam 22 through first lens element 36 of the lens portion of the cat's eye reflector, prior to passing beam 22 through interference filter 30; then passing filtered feedback beam 32 through second lens element 38 of the lens portion of the cat's eye reflector; then reflecting filtered feedback beam 32 off a mirror portion (such as mirror 40) of the cat's eye reflector to form a reflected feedback beam 46; and finally passing reflected feedback beam 46 back through the lens portion of the cat's eye reflector.

Of course, it is to be understood that the coupling step may instead include the sub-steps of passing feedback beam 22' through the lens portion (e.g., first and second cylindrical lens elements 36' and 38') of the cat's eye reflector, prior to passing beam 22' through interference filter 30'; then reflecting filtered feedback beam 32' off a mirror portion (such as mirror 40') of the cat's eye reflector to form a reflected feedback beam 46'; and finally passing reflected feedback beam 46' back through the lens portion of the cat's eye lens and mirror assembly.

The step of collimating the light output preferably includes passing it through a cylindrical fiber type collimating lens 18 prior to passing it through beamsplitter means 20, and preferably also includes passing feedback beam 22 through vertical collimation lens 16 subsequent to passing the light output through the beamsplitter means 20. The step of passing the light output through beamsplitter means 20 preferably includes passing it through half-wave plate 26 and polarizing beamsplitter 28.

A preferred procedure has been developed for laser alignment with the present invention. Initially, vertical collimation lens 16 should be located at a distance from the front facet of diode laser array 12 which is equal to the focal length of vertical collimation lens 16 plus half the thickness of the polarizing beamsplitter 28. First cylindrical lens element 36 should be located at a distance from the front facet of diode laser array 12 which is equal to the focal length of first cylindrical lens element 36 plus half the thickness of the polarizing beamsplitter 28. Second cylindrical lens element 38 should be located a distance from the front facet of high power diode laser array 12 which is equal to twice the focal length of first cylindrical lens element 36 plus the focal length of second cylindrical lens element 38 plus half the thickness of the polarizing beamsplitter 28. Finally, feedback mirror 40 may be located at a distance measured from the front facet of diode laser array 12 which is equal to twice the focal length of first cylindrical lens element 36 plus twice the focal length of second cylindrical lens element 38 plus half the thickness of polarizing beamsplitter 28. The cylindrical fiber-type lens 18 can normally be best aligned and mounted by the manufacturer of the diode laser array 12.

The position of first cylindrical lens element 36 can be adjusted by turning up the laser power to 1–2 watts and inserting a mirror in between lens elements 36, 38 to project the laser beam onto a far wall. The position of first lens element 36 should then be adjusted until a sharp image of the diode laser array 12 can be seen on the wall. This positions the lens 36 one focal length from the diode laser array 12 so as to minimize the horizontal beam divergence through the interference filter 30.

Next, a card should be placed directly in front of feedback mirror 40. The mirror position should then be adjusted until a sharp image of the diode laser array 12 is observed. Next, the laser beam should be observed directly in front of the vertical collimation lens 16. The height of the beam should be noted. The position of the vertical collimation lens 16 should be adjusted until the image of the diode laser array 12 on the mirror 40 has approximately the same height as does the beam before the vertical collimation lens 16. This height should be mostly due to the "smile" of the diode laser array 12, and is typically on the order of 2–6 mm.

The next step in the procedure is preferably done with a spectrometer in order to observe the laser spectrum. A suitable spectrometer is a 25 cm focal length monochromator equipped with a CCD linear array at the exit focal plane. With the feedback beam 22 blocked, the laser current should be lowered to about 0.2–0.5 amperes below threshold (at threshold, one can observe a change in the laser spectrum from a very broad (many nanometers) low intensity feature to a sharp spectral feature (or possibly more than one sharp spectral feature)). One can also observe threshold by noting the change in the brightness of the laser beam. Adjust the half-wave plate 26 so that about 50% of the laser light goes into each beam, that is, about half into feedback beam 22 and about half into usable beam 24. To achieve this condition, the half wave plate 26 should be oriented at about 22.5° with respect to its optical axis. With small adjustments on the vertical and horizontal tilt of the feedback mirror 40, it should be possible to bring the laser above threshold. The mirror adjustment should be optimized to maximize the laser output.

The next step in the alignment procedure includes observing the image of the diode laser array 12 on the feedback mirror 40. As the vertical tilt is adjusted, it is possible to observe the laser going above and below threshold by noting changes in the brightness of the beam. Because an image of the laser array 12 is formed on the feedback mirror 40, this effect can be observed for each individual laser output facet 44. If the vertical collimation lens 16 is not correctly positioned, then on a given laser sub array 42, the laser output facets 44 which are centrally located will be observed to come above threshold for a slightly different vertical tilt of the feedback mirror 40 than will those facets 44 which are outwardly located. The position of the vertical collimation lens 16 should be adjusted until the entire array 12 comes above and below threshold in unison with vertical tilt adjustments. Finally, the position of the feedback mirror 40 should be adjusted to optimize the laser intensity as seen on the feedback mirror 40. This adjustment should be carried out with the laser still operating below the feedback-less threshold. The laser current should be lowered, and a new value for threshold should be noted. With good alignment, the threshold current can typically be lowered by as much as 20–30%. This step concludes the initial optimization of the laser alignment.

Following the initial optimization of laser alignment, optimization of feedback narrowing should then be carried out. This should be done using a spectrometer. The interference filter 30 should be inserted into the path of the feedback beam 22. The optimum position has been found to be at the focal plane of the first cylindrical lens element 36. The laser current should be turned up a few amperes above threshold. By tilting the filter 30 about the horizontal axis, it should be possible to observe a new peak in the laser spectrum due to feedback through the filter 30. WARNING: CARE SHOULD BE TAKEN IN PERFORMING THESE ADJUSTMENTS SINCE THERE WILL BE DANGEROUS AMOUNTS OF LIGHT INTENSITY REFLECTED OFF OF THE FILTER 30 IN BOTH THE FORWARD AND BACKWARD DIRECTIONS. The tilt of the filter 30 should be adjusted so that the new peak is just outside of the feedback-less lasing spectrum. One should then rotate through the optimizations discussed above (tilt of feedback mirror 40, position of vertical collimation lens 16 and position of feedback mirror 40) to optimize the amount of laser intensity in the feedback peak.

Finally, once these optimizations are complete, the angle of the half wave plate 26 should be adjusted so that only 10–20% of the light is directed into the feedback arm (i.e., feedback beam 22 has only 10–20% of the light in output light beam 14). Turn the laser up to its operating current and adjust the tilt angle of filter 30 so that the feedback peak overlaps the feedback-less spectrum (and, of course, is transmitting only the final desired operating wavelength). If the laser is aligned well, all or most of the laser intensity should be seen in the feedback peak, with a linewidth comparable to the transmission linewidth of the interference filter 30.

As a result of the foregoing, the present invention provides an apparatus and method for spectral narrowing of the output from a high power diode laser array. The method is efficient and inexpensive. The apparatus, unlike prior art devices, can be effectively employed with large, high-power diode laser arrays having many individual laser elements.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A method for spectral narrowing of light output from a high power diode laser array, said method comprising the steps of:
   (a) collimating said light output;
   (b) passing said light output through beamsplitter means to separate said light output into a feedback beam and a usable beam;
   (c) passing said feedback beam through an interference filter having a narrow passband about a desired wavelength to form a filtered feedback beam; and
   (d) coupling said filtered feedback beam back into said diode laser array.

2. A method in accordance with claim 1, wherein said coupling step includes:
   passing said feedback beam through a cat's eye reflector.

3. A method in accordance with claim 1, wherein said coupling step includes the sub-steps of:
   prior to step (c), passing said feedback beam through a lens portion of a cat's eye reflector;
   subsequent to step (c), reflecting said filtered feedback beam off a mirror portion of said cat's eye reflector to form a reflected feedback beam; and
   passing said reflected feedback beam back through said lens portion of said cat's eye reflector.

4. A method in accordance with claim 1, wherein said collimating step includes:
   passing said light output through a cylindrical fiber type collimating lens prior to step (b).

5. A method in accordance with claim 4, wherein said collimating step further includes:
   passing said feedback beam through a vertical collimation lens subsequent to step (b).

6. A method in accordance with claim 1, wherein step (b) includes passing said light output through a half-wave plate and a polarizing beamsplitter.

7. A method in accordance with claim 1, wherein said coupling step includes the sub-steps of:
   prior to step (c), passing said feedback beam through a first lens element of a lens portion of a cat's eye reflector;
   subsequent to step (c), passing said filtered feedback beam through a second lens element of said lens portion of said cat's eye reflector;
   reflecting said filtered feedback beam off a mirror portion of said cat's eye reflector to form a reflected feedback beam; and
   passing said reflected feedback beam through said lens portion of said cat's eye reflector.

8. An apparatus for spectral narrowing of light output from a high power diode laser array comprising:
   (a) a high power diode laser array configured for production of an output light beam;
   (b) a collimator, said collimator being operatively associated with said diode laser array for collimation of said output light beam;
   (c) beamsplitter means positioned to receive said output light beam and separate said output light beam into a feedback beam and a usable beam;
   (d) an interference filter positioned to receive said feedback beam, said filter having a narrow passband about a desired wavelength, said filter forming a filtered feedback beam; and
   (e) a cat's eye reflector, said cat's eye reflector being positioned to receive said feedback beam, to direct said feedback beam through said interference filter, and to couple said filtered feedback beam back into said diode laser array.

9. An apparatus in accordance with claim 8, wherein said collimator includes a cylindrical fiber type collimating lens intermediate said diode laser array and said beamsplitter means.

10. An apparatus in accordance with claim 9, wherein said collimator further includes a vertical collimation lens positioned intermediate said beamsplitter means and said cat's eye reflector.

11. An apparatus in accordance with claim 8, wherein said cat's eye reflector includes:
   first and second cylindrical lens elements positioned intermediate said beamsplitter means and said interference filter; and
   a mirror positioned adjacent a far side of said interference filter.

12. An apparatus in accordance with claim 8, wherein said beamsplitter means includes:
   a half-wave plate; and
   a polarizing beamsplitter.

13. An apparatus in accordance with claim 8, wherein said cat's eye reflector includes:
   a first cylindrical lens element positioned intermediate said beamsplitter means and said interference filter;
   a mirror; and
   a second cylindrical lens element positioned intermediate said interference filter and said mirror.

* * * * *

UNITED STATES PATENT AND TRADEMARK OFFICE
CERTIFICATE OF CORRECTION

PATENT NO.   : 5,793,784
DATED        : August 11, 1998
INVENTOR(S)  : Wagshul et al.

It is certified that error appears in the above-indentified patent and that said Letters Patent is hereby corrected as shown below:

<u>In Column 7, Line 23,</u>   the patent now reads "$[1-(n_o/n_c)^2\sin^2\alpha]^{1/2}$"; this should read --$[1-(n_o/n_e)^2\sin^2\alpha]^{1/2}$--.

<u>In Column 7, Line 29,</u>   the patent now reads "$n_c$=effective"; this should read --$n_e$=effective--.

<u>In Column 9, Line 55,</u>   the patent now reads "as to mninimize the"; this should read --as to minimize the--.

Signed and Sealed this

First Day of December, 1998

Attest:

Attesting Officer

BRUCE LEHMAN

Commissioner of Patents and Trademarks